United States Patent
Ypma et al.

(10) Patent No.: US 11,099,486 B2
(45) Date of Patent: Aug. 24, 2021

(54) GENERATING PREDICTED DATA FOR CONTROL OR MONITORING OF A PRODUCTION PROCESS

(71) Applicant: ASML NETHERLANDS B.V., Veldhoven (NL)

(72) Inventors: Alexander Ypma, Veldhoven (NL); Dimitra Gkorou, Eindhoven (NL); Georgios Tsirogiannis, Eindhoven (NL); Thomas Leo Maria Hoogenboom, Breda (NL); Richard Johannes Franciscus Van Haren, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/477,619

(22) PCT Filed: Dec. 13, 2017

(86) PCT No.: PCT/EP2017/082553
§ 371 (c)(1),
(2) Date: Jul. 12, 2019

(87) PCT Pub. No.: WO2018/133999
PCT Pub. Date: Jul. 26, 2018

(65) Prior Publication Data
US 2019/0369503 A1 Dec. 5, 2019

(30) Foreign Application Priority Data
Jan. 23, 2017 (EP) ..................... 17152659

(51) Int. Cl.
*G03F 7/20* (2006.01)
*G05B 19/418* (2006.01)
*H01L 21/66* (2006.01)

(52) U.S. Cl.
CPC .......... *G03F 7/70525* (2013.01); *G03F 7/705* (2013.01); *G03F 7/70633* (2013.01);
(Continued)

(58) Field of Classification Search
CPC .. G03F 7/705; G03F 7/70633; G03F 7/70625; G03F 7/7065; G03F 7/70516;
(Continued)

(56) References Cited

U.S. PATENT DOCUMENTS

| | | |
|---|---|---|
| 2014/0172394 A1 | 6/2014 | Kuznetsov et al. |
| 2016/0148850 A1 | 5/2016 | David |

(Continued)

FOREIGN PATENT DOCUMENTS

| | | |
|---|---|---|
| TW | 201516598 | 5/2015 |
| TW | 201530333 | 8/2015 |

OTHER PUBLICATIONS

International Search Report issued in corresponding PCT Patent Application No. PCT/EP2017/082553, dated May 11, 2018.
(Continued)

*Primary Examiner* — Mesfin T Asfaw
(74) *Attorney, Agent, or Firm* — Pillsbury Winthrop Shaw Pittman LLP

(57) ABSTRACT

A technique to generate predicted data for control or monitoring of a production process to improve a parameter of interest. Context data associated with operation of the production process is obtained. Metrology/testing is performed on the product of the production process, thereby obtaining performance data. A context-to-performance model is provided to generate predicted performance data based on labeling of the context data with performance data. This is an instance of semi-supervised learning. The context-to-performance model may include the learner that performs semi-supervised labeling. The context-to-performance
(Continued)

model is modified using prediction information related to quality of the context data and/or performance data. Prediction information may include relevance information relating to relevance of the obtained context data and/or obtained performance data to the parameter of interest. The prediction information may include model uncertainty information relating to uncertainty of the predicted performance data.

21 Claims, 6 Drawing Sheets

(52) U.S. Cl.
CPC ........ *G05B 19/41875* (2013.01); *H01L 22/12* (2013.01); *G05B 2219/32194* (2013.01); *G05B 2219/45028* (2013.01)

(58) Field of Classification Search
CPC .......... G03F 1/84; G03F 1/70; G03F 7/70616; G03F 7/70683; G03F 7/70441; G03F 1/72; G03F 7/70483; G03F 7/70558; G03F 7/7085; G03F 7/3028; G03F 7/70491; G03F 7/70608; G03F 7/70991; G03F 9/70; G03F 7/70525; G03F 7/70508; G03F 7/70641; H01L 22/12; H01L 22/20; G06F 30/398; G06F 2119/18; G06F 30/367; G06F 16/25; G06F 16/28; G06F 16/90335; G06F 30/00; G05B 19/41875; G05B 2219/32194; G05B 2219/45028; G05B 2219/45031; Y02P 90/02
See application file for complete search history.

(56) References Cited

U.S. PATENT DOCUMENTS

2016/0246185 A1   8/2016  Ypma et al.
2016/0313651 A1   10/2016 Middlebrooks et al.

OTHER PUBLICATIONS

Taiwanese Office Action issued in corresponding Taiwanese Patent Application No. 107101141, dated Nov. 6, 2018.
Lenz, B., et al.: "Virtual Metrology in Semiconductor Manufacturing by means of Predictive Machine Learning Models", Proceedings of the 12th International Conference on Machine Learning and Application (ICMLA), 2013.
Kupp, N., et al.: "Integrated Optimization of Semiconductor Manufacturing: A Machine Learning Approach", IEEE International Test Conference, 2012.
Kang, P., et al.: "Semi-supervised support vector regression based on self-training with label uncertainty: An application to virtual metrology in semiconductor manufacturing", Expert Systems with Applications 51, Jan. 2016.
Halkidi, Maria: "From Unsupervised to Semi-supervised Learning Approaches", Invited tutorial, HDMS 2007.
Korean Office Action issued in corresponding Korean Patent Application No. 10-2019-7024586, dated Nov. 11, 2020.
Chinese Office Action issued in corresponding Chinese Patent Application No. 201780084076.9, dated Dec. 18, 2020.

GENERATING PREDICTED DATA FOR CONTROL OR MONITORING OF A PRODUCTION PROCESS

BACKGROUND

Cross-Reference to Related Applications

This application is the U.S. national phase entry of PCT Patent Application No. PCT/EP2017/082553, which was filed on Dec. 13, 2017, which claims the benefit of priority of European patent application no. 17152659.3, which was filed on Jan. 23, 2017 and which is incorporated herein in its entirety by reference.

Field of the Invention

The present invention relates to a method of generating predicted data for control or monitoring of a production process to improve a parameter of interest, usable, for example, in the manufacture of devices by lithographic techniques. The present invention also relates to associated computer programs and computer program products, and apparatus including a lithographic apparatus and a lithographic cell.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

Currently during lithographic processing much context data is generated. This context data is a large set of values of variables associated with measurements and machine/process settings. The quality of the lithographic process is expressed in so-called performance data consisting of a set of values of performance parameters. Performance parameters can be related to CD (critical dimension) control, overlay control (the accuracy of alignment of two layers in a device) or underlying parameters (e.g. focus and dose). Performance data is of great interest as this data allows control of the lithographic process. For example, knowledge of overlay performance will be used to take corrective actions (e.g. by changing machine settings). At the same time knowledge of performance data is instrumental for triggering out-of-range situations (e.g. for process control and finding the cause of out-of-range situation).

Often, limited performance data is available due to the relatively large effort it takes to obtain the performance data. This may interfere with the requirement that performance data should allow accurate and robust machine operation.

A commonly used strategy is to make use of models to interpolate performance data in order to achieve a denser sampling scheme associated with a spatial or temporal distribution of performance parameter values.

Another strategy often deployed is making use of statistical relations between context data and performance data. As the amount of context data is often very large this may allow creation of a substantial set of "virtual" performance data; performance data derived from a model relating context and performance data.

The problem is however that the model should be accurate and relevant enough in order for the generated virtual performance data to be most useful for controlling machine settings.

Partially-labeled datasets pose challenges in performance-predictive modeling. Limited availability of on-product performance measurements imposes the requirement of using as few measurements as possible when analyzing them in combination with context data. However, the derived model should be accurate and computationally efficient.

Performance measurements are not equally informative for an analysis. In general, measurements of similar exposures may not be that informative, it would be more effective to invest any remaining measurement time for other, more useful, measurements.

SUMMARY

The inventors have devised a way to make the context-to-performance model dynamic and self-learning using uncertainty and relevance information of context data, predicted data and/or measured performance data. It may be used for example for control of a production process to improve a parameter of interest, while avoiding or at least mitigating one or more of the associated problems mentioned above.

The invention in a first aspect provides a method of generating predicted data for control or monitoring of a production process to improve a parameter of interest, the method comprising the steps:

obtaining context data associated with operation of the production process;

obtaining performance data associated with performance of a product of the production process;

providing a context-to-performance model to generate predicted performance data based on labeling of the context data with performance data;

and modifying the context-to-performance model using prediction information related to quality of the context data.

The prediction information may comprise relevance information relating to relevance of the obtained context data and/or obtained performance data to the parameter of interest. A utility model may be used to generate labels for the labeling of the context data with performance data and the relevance information comprises uncertainty of the utility model.

The prediction information may comprise model uncertainty information relating to uncertainty of the generated predicted performance data. A machine learning algorithm is used to perform the labeling and the model uncertainty information comprises uncertainty of the machine learning algorithm.

The invention in a second aspect provides a computer program comprising computer readable instructions which, when run on suitable computer apparatus, cause the computer apparatus to perform the method of the first aspect.

The invention in a third aspect provides a computer program product comprising the computer program of the second aspect.

The invention in a fourth aspect provides an apparatus specifically adapted to carry out the steps of the method of the first aspect. The apparatus may be specifically configured as a lithographic apparatus operable to perform a lithographic production process. The apparatus may be specifically configured as a lithographic cell operable to perform a lithographic production process.

BRIEF DESCRIPTION OF THE DRAWINGS/FIGURES

Embodiments of the invention will now be described, by way of example, with reference to the accompanying drawings in which:

FIG. 1 depicts a lithographic cell or cluster in which a method according to the present invention may be used.

FIG. 2 schematically illustrates the pyramid of partially labeled context datasets and performance datasets.

FIG. 3 schematically illustrates interactive semi-supervised learning, according to an embodiment of the present invention.

DETAILED DESCRIPTION

Before describing embodiments of the invention in detail, it is instructive to present an example environment in which embodiments of the present invention may be implemented.

Figure 1:
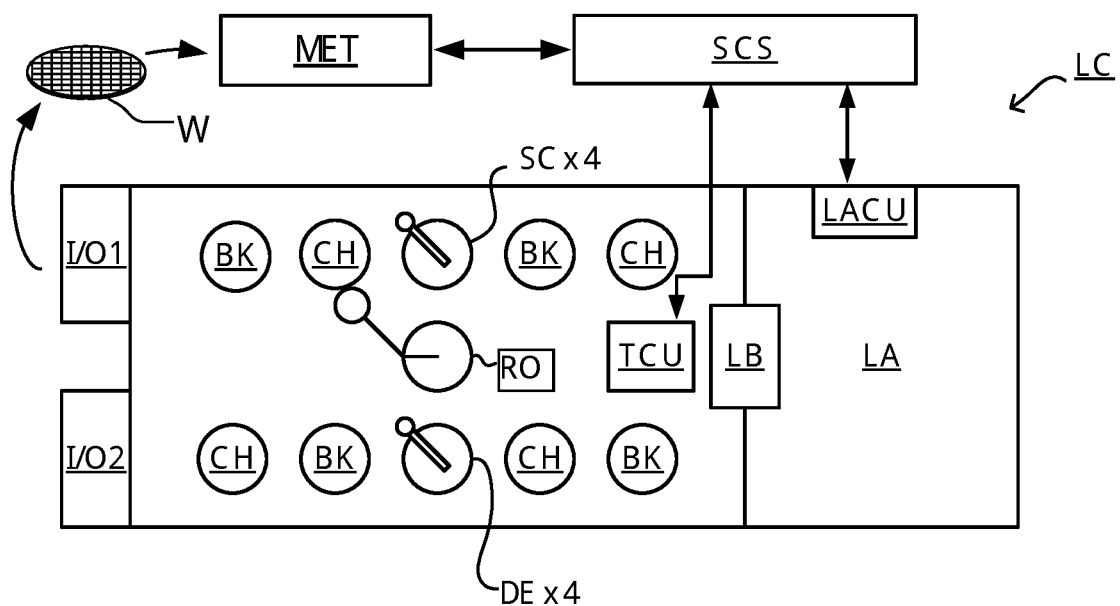

FIG. 1 depicts a lithographic cell or cluster in which an inspection apparatus according to the present invention may be used.

As shown in FIG. 1, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Context parameters of lithographic apparatus (e.g. scanner) exposures, such as exposure energy and image size, can influence scanner performance (and therefore also on-product performance, i.e. patterning performance on product wafers, like overlay or critical dimension) in linear and non-linear ways. Due to the complexity of lithographic steps, modeling the effect of scanner-related and non-scanner context parameters on patterning performance with sufficient accuracy requires full dense performance measurements for a large number of exposures. Also, some parameters are 'fixed', like image size, or can be varied only a little bit (exposure energy), so the exposures needed for complete insight are not even done in practice. These full dense performance measurements are time consuming (therefore expensive) and therefore rarely available. Meanwhile, context parameters are more easily accessible and available for a large number of exposures. Due to the cost of full dense performance measurements, context parameters are only occasionally connected to scanner and patterning performance.

In a machine learning context, a multi-dimensional data point representing context parameters is called "labeled" when the corresponding full-dense performance measurement is available, and unlabeled otherwise. This type of partially labeled dataset frequently occurs in manufacturing and poses challenges for predictive modeling. For example, a model that is predictive of device performance may require electrical measurements (e.g. using special test structures like ring oscillators), which are even harder to obtain than performance measurements. This leads to increasingly partially labeled datasets. We illustrate these data sets in FIG. 2, where each box represents a set of measurements. The size of each box is indicative of the volume of available information for each type of measurements. In general, the more informative a measurement is about device (chip) performance the more costly it may be.

Figure 2:
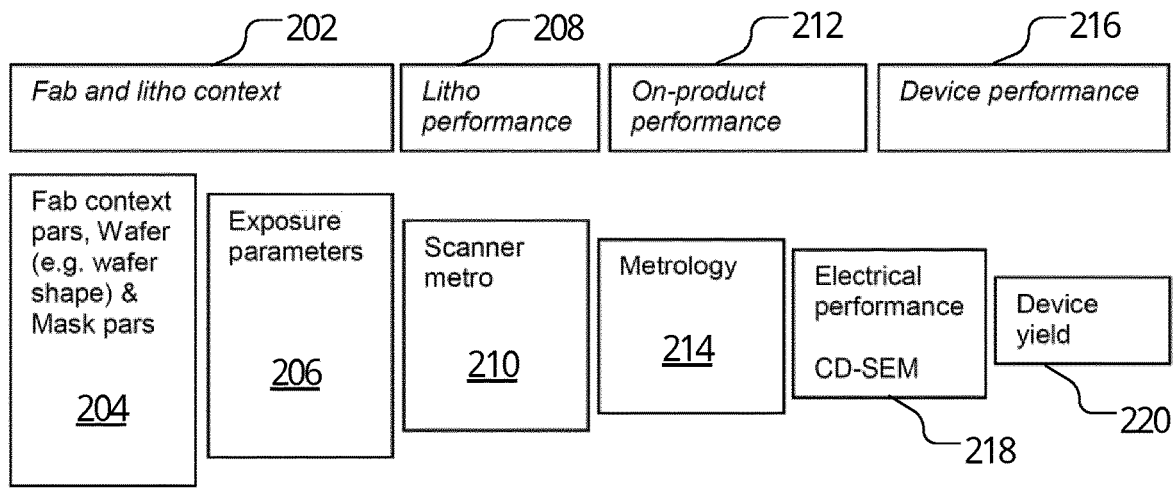

FIG. 2 illustrates the pyramid of partially labeled context datasets and performance datasets.

Going from left to right, the data is more expensive to obtain, but at the same time more directly related to actual device performance. Semiconductor fabrication facility (fab) and lithographic context data 204 includes fab context parameters, wafer (e.g. shape) and mask parameters 204. It also includes exposure parameters 206. Lithographic process performance 208 includes scanner metrology data 210. On-product performance 212 includes metrology data 214 and electrical performance 218, such as obtained with CD-SEM or expensive voltage contrast measurements. Device performance also includes device yield 220.

To further illustrate the occurrence of partially labeled data in lithography, we present two example cases of partially labelled datasets.

The first example relates to on-product overlay due to reticle heating. Reticle heating causes an overlay penalty which is captured by a set of reticle heating parameters. During an exposure, reticle heating is reflected to reticle alignment parameters such as, reticle magnification on y. As a result, reticle alignment parameters, combined with exposure settings such as image size, can model the reticle heating parameter penalty on overlay. A model which predicts reticle heating parameter penalty on overlay using only reticle alignment parameters could calibrate the scanner during the exposure. As a result, the overlay caused by reticle heating can be minimized Unlike the widely available reticle alignment parameters, determining reticle heating parameters requires costly full dense measurements.

The second example relates to wafer alignment versus overlay. Wafer aligned position deviations and signal strengths may be measured for four colors and different orders during wafer align for every wafer in a lot. Overlay metrology is usually measured on a different layout using only a subset of the wafers in a lot. Some overlay contributors can be present in wafer align measurements as well (like marker or wafer deformation patterns). Therefore the overlay can be looked upon as relevance feedback (giving a label for the data instance) to the scanner metrology.

Embodiments of the present invention may use expensive informative measurements to incrementally label less expensive and less informative contextual data (e.g. scanner measurements, scanner settings, fab context information). If the mapping between context, lithographic process parameters and metrology is visualized to a user (e.g. a local field engineer or a semiconductor manufacturer), relevance feedback from the user with respect to the need for labels or the mapping itself can be used as part of the incremental data gathering and labeling and learning of the mapping.

To overcome the scarcity of performance-labeled data, embodiments use an interactive data-driven method to perform prediction and classification tasks related to on-product performance. An active semi-supervised learning algorithm returns a map from context parameters to on-product performance using only the most informative measurements for its learning task.

Figure 3:
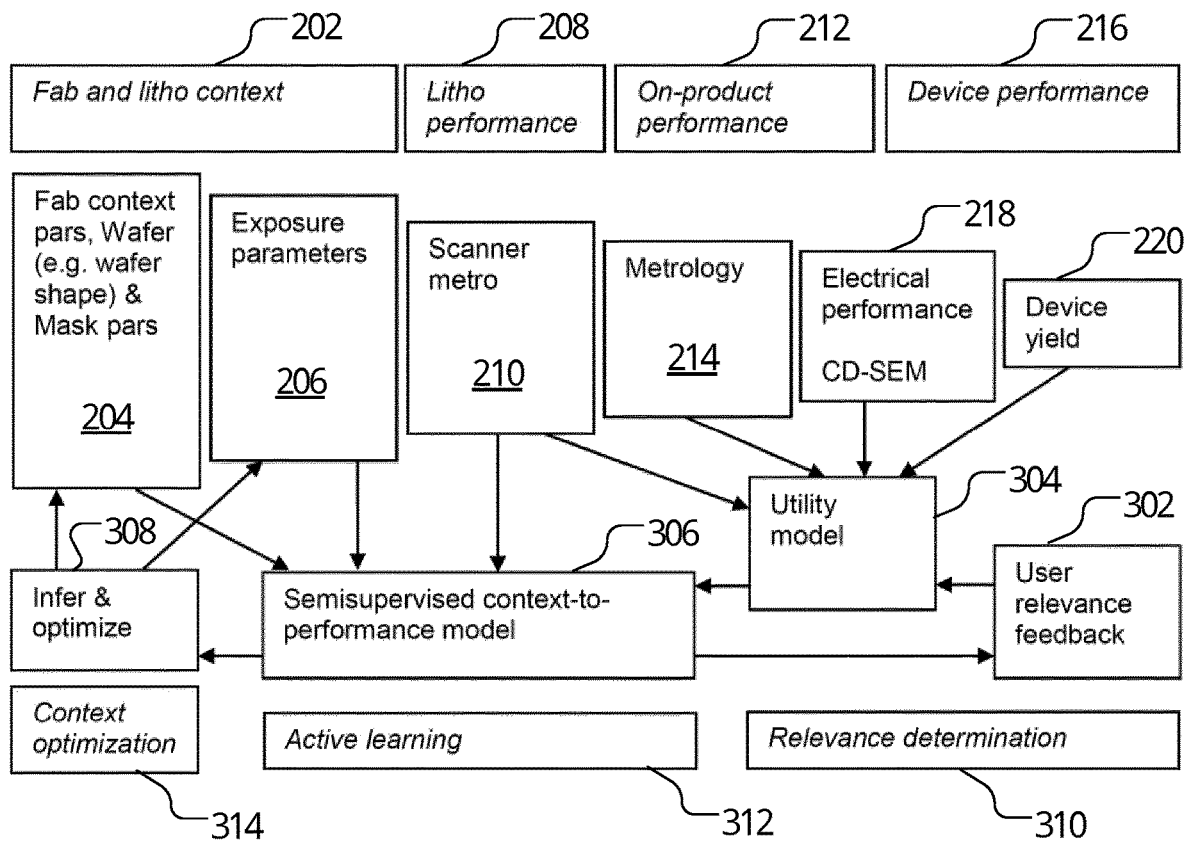

FIG. 3 illustrates interactive semi-supervised learning, according to an embodiment of the present invention. Features in common with those shown in FIG. 2 have the same reference numerals.

Highly-informative data from expensive measurements, 210, 214, 218, 220 are used for training a utility model 304 that labels the scanner data in terms of its relevance to actual device performance. The utility model 304 is used in turn to generate labels used to label the dataset (partially) and to determine the next data sample (from context, scanner, metro or from the user) to be requested. The context-to-performance model 306 is in turn used to infer contextual relations to on-product performance and suggest optimizations 308 to the current fab and lithographic process flow. These features may be more generally described as relevance determination 310, active learning 312 and context optimization 314.

Informative measurements are obtained via the interaction of the user 302. The input dataset contains unlabeled data points, namely data-points describing scanner and product/process related settings ('exposure context') and partially labeled data (e.g. with overlay metrology). The active learner builds a labeled dataset via the user relevance feedback mechanism and providing context for the next most informative performance measurement.

The high-dimensional input space may be visualized, e.g. in 2D (via a dimensionality reduction technique). In this visualization, both the labeled and unlabeled data are represented with an indication of their labels (white circles). This visualization turns a high-dimensional dataset into a plot which is interpretable by humans and so, it enables user interaction. Examples of this visualization are presented on FIGS. 6 and 7. The user observes non-trivial patterns and clusters in the represented data and requests measurements by selecting an unlabeled area (or a data point). For example, while a lot is being exposed, its exposure parameters are presented in the 2D visualization. The user observes their relative position on the plot and has the option to decide if this position is informative. Upon user request, dedicated measurements are applied on this lot after its exposure. When a user does not provide relevance feedback, the semi-supervised learning algorithm decides the next lot to be measured. After having a new measurement, the utility model turns the raw measurement data into a useful information from which the labels derive. The active learner updates its labeled dataset and computes the new predictions.

Figure 6:
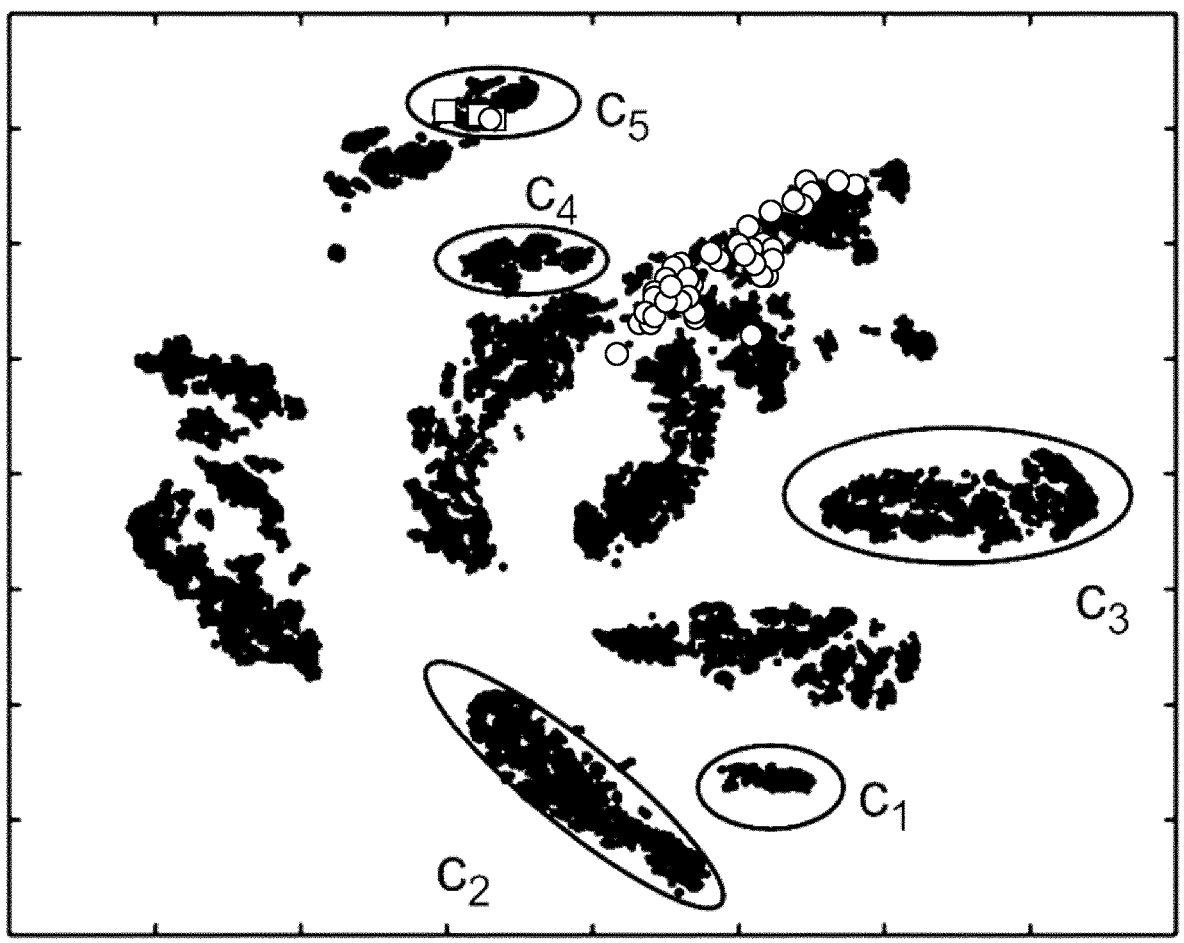
FIG. 6 is a graph illustrating the use of the use of active semi-supervised learning for semiconductor fabrication facility (fab) and lithographic process optimization.
Figure 7:
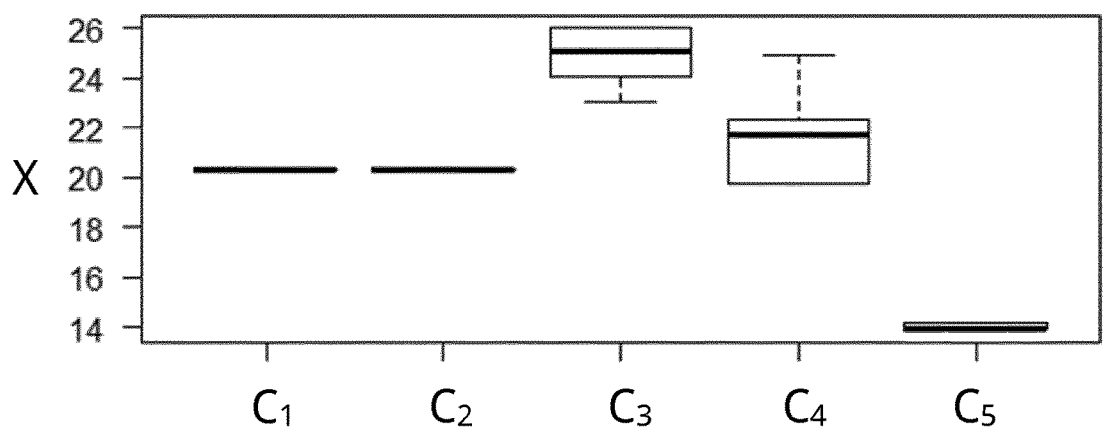
FIG. 7 is another graph illustrating the use of the use of active semi-supervised learning for fab and lithographic process optimization.

The user may be actively engaged in the analysis by providing feedback on the relevance of the selected features and the accuracy of the results. Users' feedback provides the algorithm with additional information via an interactive interface. Alternatively, additional measurements from e.g. the metrology system can be prompted interactively using the method suggested above. The features considered by the learner may be visualized using a dimensionality reduction technique as it is represented in FIGS. 6 and 7.

Informativeness can be defined before the next measurement is performed. Based on the underlying context data, one can identify wafer lots in an early phase that are likely to end up in a specific cluster. We may optimize the likelihood that we will measure a lot that contains a certain fingerprint (pattern of cross-wafer variation). The present method thus complements conventional sample scheme optimization.

A data-driven model emphasizes context parameters that correlate to the labeled data. If there is lack of data, labels or performance information, we may involve the user's subjective judgement in order to produce a meaningful customized context-to-performance model.

Figure 4:
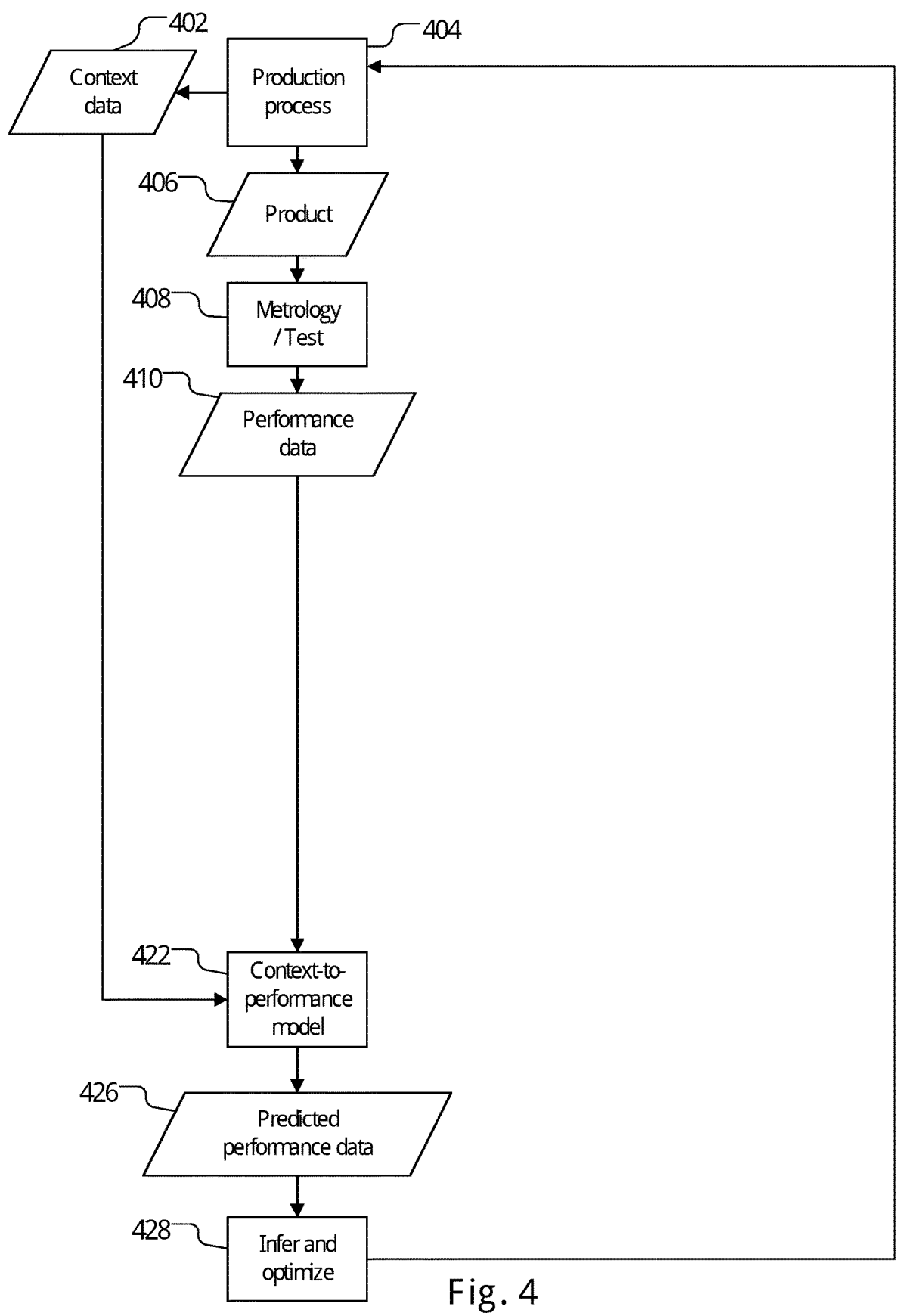
FIG. 4 is a flow chart of a method of virtual metrology according to the prior art.

FIG. 4 is a flow chart of a method of conventional virtual metrology. With reference to FIG. 4, the conventional method starts with obtaining context data 402 associated with operation of the production process 404.

Metrology/test 408 is performed on the product 406 of the production process 404, thereby obtaining performance data 410 associated with performance of the product 406.

A context-to-performance model 422 is provided to generate predicted performance data 426. The predicted performance data 426 is used to infer settings that optimize the production process 404.

Figure 5:
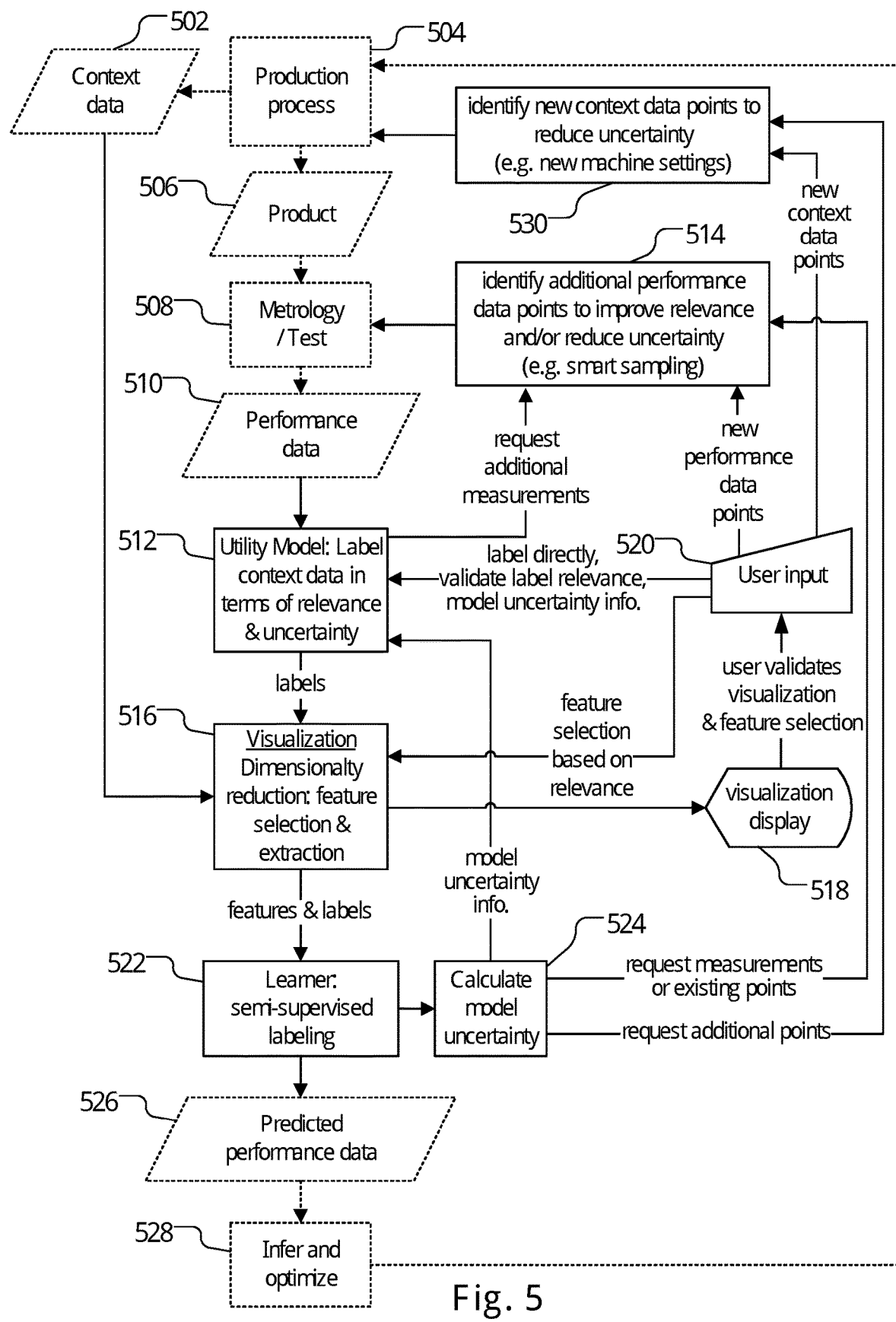
FIG. 5 is a flow chart of a method of generating predicted data for control of a production process to improve a parameter of interest according to an embodiment of the present invention.

FIG. 5 is a flow chart of a method of generating predicted data for control of a production process to improve a parameter of interest according to an embodiment of the present invention. The parameter of interest may be a particular performance parameter. Semi-supervised active learning is based on prediction information (relevance and/or model uncertainty information). Flow chart boxes with dotted borders in FIG. 5 correspond to boxes shown in FIG. 4.

With reference to FIG. 5, the method starts with obtaining context data 502 associated with operation of the production process 504.

Metrology/test 508 is performed on the product 506 of the production process 504, thereby obtaining performance data 510 associated with performance of the product 506.

A context-to-performance model is provided to generate predicted performance data 526 based on labeling of the context data 502 with performance data. This is an instance of semi-supervised learning. The context-to-performance model includes the learner 522 that performs semi-supervised labeling.

The context-to-performance model is modified using prediction information related to quality of the context data and/or performance data.

The prediction information may comprise relevance information relating to relevance of the obtained context data and/or obtained performance data to the parameter of interest. By using relevance information, labels (at the output of the context-to-performance model) are enriched via active learning. This enables the determination of a context-to-performance mapping that accurately predicts performance labels of interest. This avoids the problem of a large part of the context data being underutilized as a result of it being unlabeled.

The prediction information may comprise model uncertainty information relating to uncertainty of the generated predicted performance data 526. By using model uncertainty information, context data (at the input to the context-to-performance model) is enriched via active learning. This enables the determination of a context-to-performance mapping that generalizes well with complex contexts. This avoids the problem of biasing the mapping to a small, potentially irrelevant part of the context space.

In this example, modification is implemented using the utility model 512 and visualization module 516. The utility model 512 generates labels for labelling the context data in terms of relevance and uncertainty. In this case, the relevance information comprises uncertainty of the utility model. The utility model generates labels based on the relevance information, which are used to label context data with predicted performance data. Thus, the semi-supervised labelling is based on relevance. Using a utility model enables the determination of a context-to-performance mapping that is relevant for optimizing the parameter of interest (e.g. yield, etc.).

The visualization module 516 performs feature selection and feature extraction, and the extracted features are used to modify the context-to-performance model.

Based on the feature selection and extraction, the visualization module 516 outputs a visualization of the context data labeled with performance data to a display 518. A user sees the display and validates the visualization and feature selection. The user may label context data directly and/or may add model uncertainty information to the utility model.

A user input module 520 receives relevance information and/or model uncertainty information input by a user. The step of modifying the context-to-performance model may comprise selecting, based on the relevance information, context data for modeling. The user input, in response to the data visualization, avoids expensive data-based relevance labeling. This user input also exploits knowledge the user may have.

In this example the context-to performance model includes a learner 522, which is a machine learning algorithm that performs semi-supervised labelling automatically, using labels generated by utility model and features from the visualization module. The automatic labelling may trained based on relevance information input by the user 520 to the utility model 512. In this case, the model uncertainty information comprises uncertainty of the machine learning algorithm 522.

The relevance information associated with a first set of context data may be determined based on comparing uncertainty of predicted performance data associated with the first set of context data to uncertainty of predicted performance data associated with a second set of context data.

Based on the relevance information, additional performance data, in addition to the obtained performance data, may be identified 514 that reduces uncertainty of the generated predicted performance data and/or improves relevance of the obtained context data to the parameter of interest. The identification may be triggered by the utility model 512 requesting additional measurements. It may be triggered by the user 520 requesting new performance data points.

In order to obtain the additional performance data, a control signal is output to metrology/test 508. The control signal may be a signal that causes a new performance measurement. The control signal may be a signal to extend the performance data's database or domain.

The model uncertainty information is calculated 524. The model uncertainty information may be calculated based on: a distribution of predicted performance data; comparing of predicted performance data to previously generated predicted performance data; and/or comparing the obtained performance data to the predicted performance data. The calculated model uncertainty information may be fed back to the utility model 512. The calculated model uncertainty information may be used to identify additional performance data points 514. This may be done by requesting additional performance data measurements or by selecting existing performance data points that had not been used as input to the utility model 512.

Based on the model uncertainty information, additional context data points may be requested. Then, additional context data, in addition to the obtained context data, may be identified 530 that reduces uncertainty of the generated predicted performance data and/or improves relevance of the obtained context data to the parameter of interest.

In order to obtain the additional context data, a control signal is output. The control signal may be output to the production process 504 to cause an additional production process setting. The control signal may be output to extend the context data's database or domain.

The predicted performance data 526 is used to infer settings that optimize the production process 504.

FIG. 6 is a graph illustrating the use of the use of active semi-supervised learning for fab and lithographic process optimization.

FIG. 6 is an 8-dimensional lithographic process data visualization generated by neighborhood-preserving mapping. Each point in the graph represents a wafer lot, for which additional context information is available. Black dots are based on exposure data only. Squares and circles represent labeled lots having performance measurements (high overlay and low overlay due to reticle heating, respectively). Hence, the data set is partially labeled with performance data. Clusters are referenced as C1 to C5.

FIG. 7 is another graph illustrating the use of the use of active semi-supervised learning for fab and litho optimization.

By using the overlay as relevance feedback for the exposure parameters, we decide to find the context variable X that is discriminating between cluster C5 of FIG. 6 (with high overlay error giving low performance) and the four other clusters. The context variable is image size in the x-direction. This gives a clear lead for further optimization in IC production: dedicated reticle heating calibration for cases with small image size X.

It has been shown above that embodiments of the present invention make the context-to-performance model dynamic and self-learning using model uncertainty and relevance information of context data, predicted data and/or measured performance data.

The relevance information is associated with how relevant the context or performance parameter is (e.g. context data strongly associated with overlay, may not be relevant for product performance when a single exposure process is adopted). The user may be actively involved in selecting context and performance data based on how relevant it is for a certain parameter of interest (e.g. yield, throughput, CD control, etc.).

The uncertainty information is associated with how good the model is in predicting a performance parameter of interest using the available context information. The uncertainty level can be calculated (by analysis of the distribution of performance data), derived from benchmarking predicted data to already modeled data, derived from comparing measured performance data to predicted data or determined by the user based on a visualization of the data. An example of such visualization is the clustering of context data where performance data is added as a label. A high uncertainty of the performance data may reveal itself as inconsistent behavior across the clusters. Within one small cluster the performance data varies wildly this may indicate a large degree of uncertainty which can be assigned (by mapping) to a sub-optimal model. The user may be actively involved in selecting for which context data there is a lack of associated performance data, and hence, based on the user's insight, a data measurement is triggered that leads to a desired reduction of the uncertainty of the model. This has a clear benefit that only measurements are performed that reduce the uncertainty, preventing wasting valuable measurement time.

Based on the level of uncertainty and/or the relevance of the context and performance data, the model determines what additional data needs to be included in order to minimize the uncertainty levels and maximize the relevance level, preferentially with minimal effort. For example context data is more easily obtained than expensive measurement data. This additional data may be newly measured performance data, new context data or data outside the initially selected data set (e.g. extension of the database, incorporation new domains).

Hence the model actively controls the data which is used to predict the performance data and hence the model improves in time.

Embodiments can provide a way to exploit interactively the semiconductor manufacturer's knowledge of the relevance of data and clustering behavior. Embodiments provide a way to sample/request new measurements from a semiconductor manufacturer user or contextual data that can be used to improve the learned mappings incrementally. Embodiments provide a way to relate expensive measurements (e.g. concerning metrology, electrical performance or even device yield) to inexpensive scanner and lithographic process contextual parameters and measurements.

In embodiments, the algorithm can learn what type of measurement the user usually provides and build user profile, according to which the algorithm provides recommendations.

Active learning of the mapping between process tool usage and wafer fingerprints, without specifying precisely the nature of the tools or steps, may be performed. By using relevance feedback, the possible set of processing tools involved in generating a certain overlay or CD pattern over the wafer can be reduced to a relevant subset based on relevance feedback.

Improved root cause analysis may be achieved by improving mapping and resulting clustering and therefore improved determination of the contribution of lithographic process context parameters.

A user, monitoring a production process, may want to understand which measurements are missing from their 'big data' set. This would contribute significantly to a better understanding the multi-variate relationships in the dataset. Specifically, that would facilitate more accurately finding true positives and avoiding false positives. Continuing into diagnosis of the true positives, the user may want to know which measurements could be done proactively, in order to maximize the chance of finding a root cause with as little additional measurements as possible.

If a semi-supervised mapping between alignment and overlay is learned, one may employ future alignment measurements as an in-line lot disposition mechanism or a basis for root cause analysis. For example, one could use all four colors in a wafer align measurement and use additional metrology system X-aperture measurements for asymmetry suppression in a control setting. Hence, various combinations of overlay performance measurements can be obtained. Since the number of all possible combinations is impractical to be investigated, selective measurements can be done only on those combinations where significant difference on color-to-color and metrology system X-aperture is detected.

Embodiments of the present invention thus provide optimal exploitation of context and exposure information, enabling improved root cause investigation.

Embodiments of the preset invention may provide clues for targeted measurements. New exposure data can be requested in order to give most information. New metrology data, or a new measurement, can be requested in order to give most information on the labeling or predictivity of the mapping, by comparing the fab/exposure context of a lot to the most informative contextual region.

An embodiment of the invention may be implemented using a computer program containing one or more sequences of machine-readable instructions describing methods of method of generating predicted data, as described above. This computer program may be executed for example within the control unit LACU of FIG. 1, or some other controller. There may also be provided a data storage medium (e.g., semiconductor memory, magnetic or optical disk) having such a computer program stored therein.

Figure 8:
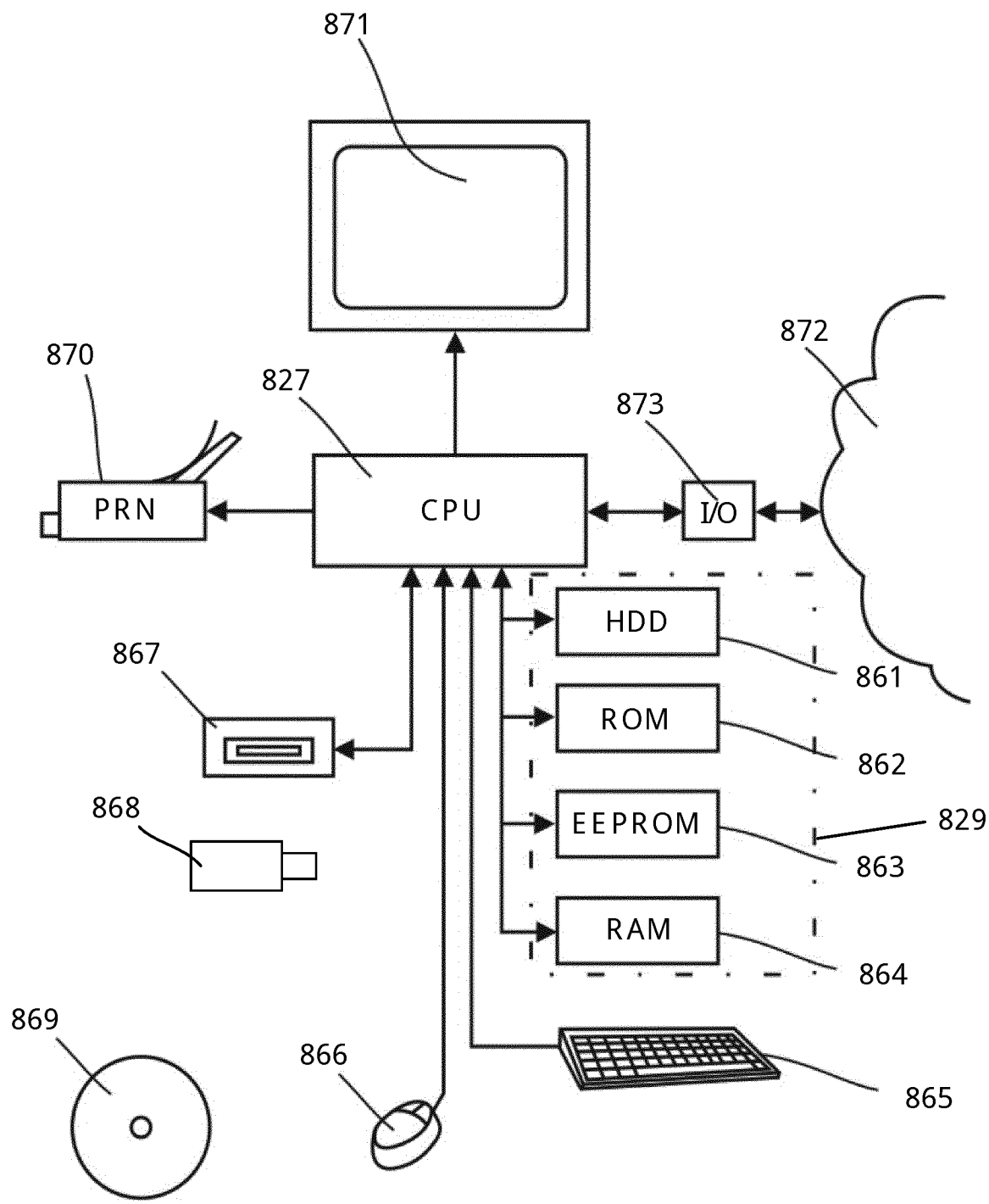
FIG. 8 illustrates computer system hardware useful in implementing the methods disclosed herein.

This control unit LACU may include a computer assembly as shown in FIG. 8. The computer assembly may be a dedicated computer in the form of a control unit in embodiments of the assembly according to the invention or, alternatively, be a central computer controlling the lithographic projection apparatus. The computer assembly may be arranged for loading a computer program product comprising computer executable code. This may enable the computer assembly, when the computer program product is downloaded, to control aforementioned uses of a lithographic apparatus with embodiments of the level and alignment sensors AS, LS.

Memory 829 connected to processor 827 may comprise a number of memory components like a hard disk 861, Read Only Memory (ROM) 862, Electrically Erasable Programmable Read Only Memory (EEPROM) 863 and Random Access Memory (RAM) 864. Not all aforementioned memory components need to be present. Furthermore, it is not essential that aforementioned memory components are physically in close proximity to the processor 827 or to each other. They may be located at a distance away.

The processor 827 may also be connected to some kind of user interface, for instance a keyboard 865 or a mouse 866. A touch screen, track ball, speech converter or other interfaces that are known to persons skilled in the art may also be used.

The processor 827 may be connected to a reading unit 867, which is arranged to read data, e.g. in the form of computer executable code, from and under some circumstances store data on a data carrier, like a solid-state drive 868 or a CDROM 869. Also DVD's or other data carriers known to persons skilled in the art may be used.

The processor 827 may also be connected to a printer 870 to print out output data on paper as well as to a display 871, for instance a monitor or LCD (Liquid Crystal Display), of any other type of display known to a person skilled in the art.

The processor 827 may be connected to a communications network 872, for instance a public switched telephone network (PSTN), a local area network (LAN), a wide area network (WAN) etc. by means of transmitters/receivers 873 responsible for input/output (I/O). The processor 827 may be arranged to communicate with other communication systems via the communications network 872. In an embodiment of the invention external computers (not shown), for instance personal computers of operators, can log into the processor 827 via the communications network 872.

The processor 827 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 827 may even be located a distance away of the other processing units and communicate via communications network 872. Connections between modules can be made wired or wireless.

The computer system can be any signal processing system with analogue and/or digital and/or software technology arranged to perform the functions discussed here.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

Further embodiments of the invention are disclosed in the list of numbered embodiments below:

1. A method of generating predicted data for control or monitoring of a production process to improve a parameter of interest, the method comprising the steps:
   obtaining context data associated with operation of the production process;
   obtaining performance data associated with performance of a product of the production process;
   providing a context-to-performance model to generate predicted performance data based on labeling of the context data with performance data;
   and
   modifying the context-to-performance model using prediction information related to quality of the context data and/or performance data.

2. The method of embodiment 1 wherein the prediction information comprises relevance information relating to relevance of the obtained context data and/or obtained performance data to the parameter of interest.

3. The method of embodiment 2 wherein a utility model is used to generate labels for the labeling of the context data with performance data and the relevance information comprises uncertainty of the utility model.

4. The method of embodiment 2 or embodiment 3 wherein the step of modifying the context-to-performance model comprises the steps:
   outputting a visualization of the context data and performance data; and
   receiving the relevance information input by a user.

5. The method of any of embodiments 2 to 4 wherein the step of modifying the context-to-performance model comprises selecting, based on the relevance information, context data for modeling.

6. The method of any of embodiments 2 to 5 wherein the step of modifying the context-to-performance model comprises the labeling of context data with the predicted performance data based on the relevance information.

7. The method of embodiment 6 wherein the labelling is performed automatically.

8. The method of embodiment 7 wherein the automatic labelling is trained based on relevance information input by a user.

9. The method of any of embodiments 2 to 8 further comprising the step of determining the relevance information associated with a first set of context data based on comparing uncertainty of predicted performance data associated with the first set of context data to uncertainty of predicted performance data associated with a second set of context data.

10. The method of any preceding embodiment further comprising the steps:
    identifying, based on the relevance information, additional performance data, in addition to the obtained performance data, that:
    reduces uncertainty of the generated predicted performance data; and/or
    improves relevance of the obtained context data to the parameter of interest; and
    outputting a control signal for obtaining the additional performance data.

11. The method of embodiment 10 wherein the control signal comprises a signal to cause a new performance measurement.

12. The method of embodiment 10 or embodiment 11 wherein the control signal comprises a signal to extend the performance data's database or domain.

13. The method of any preceding embodiment wherein the prediction information comprises model uncertainty information relating to uncertainty of the generated predicted performance data.

14. The method of embodiment 13 wherein a machine learning algorithm is used to perform the labeling and the model uncertainty information comprises uncertainty of the machine learning algorithm.

15. The method of embodiment 13 or claim 14 wherein the step of modifying the context-to-performance model comprises the steps:
    outputting a visualization of the context data and performance data; and
    receiving the model uncertainty information input by a user.

16. The method of any of embodiments 13 to 15 further comprising the step of calculating the model uncertainty information based on a distribution of predicted performance data.

17. The method of any of embodiments 13 to 16 further comprising the step of calculating the model uncertainty information based on comparing of predicted performance data to previously generated predicted performance data.

18. The method of any of embodiments 13 to 17 further comprising the step of calculating the model uncertainty information based on comparing the obtained performance data to the predicted performance data.

19. The method of any for embodiments 13 to 18 further comprising the step of identifying, based on the model uncertainty information, additional context data, in addition to the obtained context data, that:
reduces uncertainty of the generated predicted performance data; and/or
improves relevance of the obtained context data to the parameter of interest.

20. The method of embodiment 19 further comprising the step of outputting a control signal for obtaining the additional context data.

21. The method of embodiment 20 wherein the control signal comprises a signal to cause an additional production process setting.

22. The method of embodiment 20 or embodiment 21, wherein the control signal comprises a signal to extend the context data's database or domain.

23. A computer program comprising computer readable instructions which, when run on suitable computer apparatus, cause the computer apparatus to perform the method of any one of embodiments 1 to 22.

24. A computer program product comprising the computer program of embodiment 23.

25. Apparatus specifically adapted to carry out the steps of the method of any of embodiments 1 to 22.

26. Apparatus according to embodiment 25 specifically configured as a lithographic apparatus operable to perform a lithographic production process.

27. Apparatus according to embodiment 25 specifically configured as a lithographic cell operable to perform a lithographic production process.

The breadth and scope of the present invention should not be limited by any of the above-described exemplary embodiments, but should be defined only in accordance with the following claims and their equivalents.

The invention claimed is:

1. A method of generating predicted data for control or monitoring of a production process involving lithographic processing using a lithographic apparatus, to improve a parameter of interest, the method comprising:
    obtaining context data associated with operation of the production process;
    obtaining performance data associated with performance of a product of the production process;
    providing a context-to-performance model to generate predicted performance data based on labeling of the context data with performance data, wherein the context-to-performance model includes a learner performing semi-supervised labeling; and
    modifying the context-to-performance model using prediction information related to quality of the context data.

2. The method of claim 1, wherein the prediction information comprises relevance information relating to relevance of the obtained context data and/or obtained performance data to the parameter of interest.

3. The method of claim 2, wherein a utility model is used to generate labels for the labeling of the context data with performance data, and the relevance information comprises uncertainty of the utility model.

4. The method of claim 2, wherein the modifying the context-to-performance model comprises:
    outputting a visualization of the context data and performance data; and
    receiving the relevance information as an input by a user.

5. The method of claim 2, wherein the modifying the context-to-performance model comprises selecting, based on the relevance information, context data for modeling.

6. The method of claim 2, wherein the modifying the context-to-performance model comprises labeling of context data with the predicted performance data based on the relevance information.

7. The method of claim 6, wherein the labelling is performed automatically and the automatic labelling is trained based on relevance information input by a user.

8. The method of claim 2, further comprising determining the relevance information associated with a first set of context data based on comparing uncertainty of predicted performance data associated with the first set of context data to uncertainty of predicted performance data associated with a second set of context data.

9. The method of claim 2, further comprising:
    identifying, based on the relevance information, additional performance data, in addition to the obtained performance data, that:
    reduces uncertainty of the generated predicted performance data, and/or improves relevance of the obtained context data to the parameter of interest; and outputting a control signal for obtaining the additional performance data.

10. The method of claim 9, wherein the control signal comprises a signal to cause a new performance measurement.

11. The method of claim 1, wherein the prediction information comprises model uncertainty information relating to uncertainty of the generated predicted performance data.

12. The method of claim 11, wherein the modifying the context-to-performance model comprises outputting a visualization of the context data and performance data; and receiving the model uncertainty information as an input by a user.

13. The method of claim 11, further comprising identifying, based on the model uncertainty information, additional context data, in addition to the obtained context data, that:

reduces uncertainty of the generated predicted performance data, and/or improves relevance of the obtained context data to the parameter of interest.

14. A non-transitory computer program product comprising computer readable instructions therein, the instructions, upon execution by a computer system, configured to cause the computer system to at least:

obtain context data associated with operation of a production process;

obtain performance data associated with performance of a product of the production process;

provide a context-to-performance model to generate predicted performance data based on labeling of the context data with performance data, the context-to-performance model configured to generate predicted data for control or monitoring of the production process to improve a parameter of interest and the context-to-performance model includes a learner performing semi-supervised labeling; and modify the context-to-performance model using prediction information related to quality of the context data.

15. The computer program product of claim 14, wherein the prediction information comprises relevance information relating to relevance of the obtained context data and/or obtained performance data to the parameter of interest.

16. The computer program product of claim 15, wherein the instructions are further configured to cause the computer to use a utility model to generate labels for the labeling of the context data with performance data, and the relevance information comprises uncertainty of the utility model.

17. The computer program product of claim 15, wherein the instructions configured to modify the context-to-performance model are further configured to cause the computer to:

output a visualization of the context data and performance data and receive the relevance information as an input by a user; and/or select, based on the relevance information, context data for modeling; and/or label context data with the predicted performance data based on the relevance information.

18. The computer program product of claim 15, wherein the instructions are further configured to cause the computer system to:

identify, based on the relevance information, additional performance data, in addition to the obtained performance data, that:

reduces uncertainty of the generated predicted performance data, and/or improves relevance of the obtained context data to the parameter of interest; and output a control signal for obtaining the additional performance data.

19. The computer program product of claim 14, wherein the prediction information comprises model uncertainty information relating to uncertainty of the generated predicted performance data.

20. A lithographic apparatus configured to perform a lithographic production process, the lithographic apparatus comprising the computer program product of claim 14.

21. A non-transitory computer program product comprising computer readable instructions therein, the instructions, upon execution by a computer system, configured to cause the computer system to at least:

obtain context data associated with operation of a production process;

obtain performance data associated with performance of a product of the production process;

provide a context-to-performance model to generate predicted performance data based on labeling of the context data with performance data, the context-to-performance model configured to generate predicted data for control or monitoring of the production process to improve a parameter of interest; and modify the context-to-performance model using prediction information comprising relevance information relating to relevance of the obtained context data to the parameter of interest, wherein the modification of the context-to-performance model comprises selection, based on the relevance information, of context data for modeling.

* * * * *